(12) United States Patent
Hartong et al.

(10) Patent No.: US 12,100,585 B2
(45) Date of Patent: Sep. 24, 2024

(54) ENERGY SPECTROMETER WITH DYNAMIC FOCUS

(71) Applicant: FEI Company, Hillsboro, OR (US)

(72) Inventors: Arthur Reinout Hartong, Eindhoven (NL); Alexander Henstra, Eindhoven (NL); Sorin Lazar, Eindhoven (NL); Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 131 days.

(21) Appl. No.: 17/363,641

(22) Filed: Jun. 30, 2021

(65) Prior Publication Data

US 2023/0005733 A1 Jan. 5, 2023

(51) Int. Cl.
*H01J 49/46* (2006.01)
*H01J 37/26* (2006.01)

(52) U.S. Cl.
CPC .......... *H01J 49/46* (2013.01); *H01J 37/26* (2013.01); *H01J 2237/24485* (2013.01)

(58) Field of Classification Search
CPC .............. H01J 37/26; H01J 37/244; H01J 2237/24485; H01J 49/46
See application file for complete search history.

(56) References Cited

U.S. PATENT DOCUMENTS

| 9,966,219 | B2 | 5/2018 | Gubbens et al. | |
| 2010/0155623 | A1* | 6/2010 | Eisner | H01J 37/3171 250/281 |
| 2012/0205537 | A1 | 8/2012 | Jiang | |
| 2017/0125210 | A1* | 5/2017 | Henstra | H01J 37/26 |
| 2017/0207058 | A1* | 7/2017 | Gubbens | H01J 37/244 |
| 2019/0341243 | A1* | 11/2019 | Freitag | H01J 49/44 |

OTHER PUBLICATIONS

Craven et al., "Getting the Most Out of a Post-Column EELS Spectrometer on a TEM/STEM b Optimizing the Optical Coupling", Ultramicroscopy 180 (2017) 66-80 (Year: 2017).*
Craven, et al. "Getting the Most Out of a Post-Column EELS Spectrometer in a TEM/STEM by Optimizing the Optical Coupling", Ultramicroscopy 180 (2017) 66-80 (Year: 2017).*

(Continued)

*Primary Examiner* — David E Smith
(74) *Attorney, Agent, or Firm* — Michael Best & Friedrich LLP

(57) ABSTRACT

An energy spectrometer with dynamic focus for a transmission electron microscope (TEM) is disclosed herein. An example energy spectrometer and TEM at least includes a charged particle column including a projection system arranged after a sample plane, the projection system is operated in a first configuration; an energy spectrometer coupled to the charged particle column to acquire one or more energy loss spectra. The energy spectrometer including a dispersive element, a bias tube, optics for magnifying the energy loss spectrum and for correcting aberrations, and a detector arranged conjugate to a spectrum plane of the energy spectrometer, wherein the energy spectrometer further includes an optical element electrically biased to refocus at least a portion of a spectrum onto the detector, and wherein the value of the electrical bias is at least partially based on the first configuration of the charged particle column.

14 Claims, 5 Drawing Sheets

(56) References Cited

OTHER PUBLICATIONS

Craven et al., "Getting the most out of a post-column EELS spectrometer on a TEM/STEM by optimising the optical coupling", Ultramicroscopy, vol. 180, XP085062215, Apr. 1, 2017 (Apr. 1, 2017), pp. 66-80.

EP22182143.2, Extended European Search Report, Nov. 21, 2022, 8 pages.

Schmidt O., et al., "Chemical Microanalysis by Selected-Area ESCA using an Electron Energy Filter in a Photoemission Microscope," Journal of Electron Spectroscopy and Related Phenomena, Mar. 1, 1998, vol. 88-91, XP005625688, pp. 1009-1014.

\* cited by examiner

ENERGY SPECTROMETER WITH DYNAMIC FOCUS

FIELD OF THE INVENTION

The invention relates generally to charged particle microscopes, and specifically to energy spectrometers included in charged particle microscopes that provide for dynamic refocusing of electron beams based on changes in microscope operating parameters.

BACKGROUND OF THE INVENTION

Charged particle microscopy, such as transmission electron microscopy, uses an array of detection techniques to obtain various information about a sample. One such technique is called electron energy loss spectroscopy (EELS), where an electron beam emerging from a sample is dispersed into an energy spectrum and one or more bands of energy are individually imaged. In the current iteration of EELS, however, there is a loss of energy resolution due to a variety of issues, such as microscope misalignments, chromatic aberrations, and unintended lensing effects. All of these issues add up and result in a loss of energy resolution on the EELS detector. This loss of resolution may be at least partially due to a desired portion of an electron beam not being focused on a spectrum plane of the EELS system due to these issues. For example, the electron beam transmitted through a sample may have a different focal point exiting an objective lens due to chromatic aberrations of the objective lens. This change in focal point along the optical axis will translate into a change in location of a crossover plane in the electron energy loss spectrometer (or simply 'energy spectrometer') with respect to a spectrum plane. This change in location with respect to the spectrum plane may lead to a defocus of the electron beam at the EELS detector, and by that, may affect the energy resolution on the EELS detector. These effects of spectrum defocus may be compensated (partially) by proper (re-)focusing of the energy spectrometer. However, as the microscope's and energy spectrometer's operating parameters are varied, such as needed to change magnification or to select different energy bands of the electron beam, this defocus at the detector may change, and by that, loss of resolution at the EELS detector may change and the previously obtained focus-setting of the spectrometer may no longer be optimal. Accordingly, the degree of energy resolution loss is dependent on the operating parameters, and a solution may be needed for each permutation of operating parameters.

SUMMARY

An energy spectrometer with dynamic focus for a transmission electron microscope (TEM) is disclosed herein. An example energy spectrometer and TEM at least includes a charged particle column including a projection system arranged after a sample lane, the projection system is operated in a first configuration; an energy spectrometer coupled to the charged particle column to acquire one or more energy loss spectra, the energy spectrometer including: a dispersive element, a bias tube, optics for magnifying an energy loss spectrum and for correcting aberrations, and a detector arranged conjugate to a spectrum plane of the energy spectrometer, wherein the energy spectrometer further includes an optical element electrically biased to refocus at least a portion of the energy loss spectrum onto the detector, and wherein the value of the electrical bias is at least partially based on the first configuration of the charged particle column.

Another example at least includes a source coupled to provide a beam of electrons toward a sample, a projection system coupled to collect the beam of electrons after passing through the sample and direct the beam of electrons along an optical axis, the projection system configured to operate on first operating parameters, and an energy spectrometer coupled to receive the beam of electrons from the projection system. The energy spectrometer including a dispersive device with a bias tube, the dispersive device coupled to steer the beam of electrons into a plurality of energy bands, a detector arranged conjugate to a spectrum plane of the energy spectrometer, a plurality of lenses or multipoles downstream from the dispersive device and arranged to direct the energy bands onto the detector, and an optical element arranged and electrically biased to refocus the energy bands onto the detector, the level of the electrical bias based on the first operating parameters.

BRIEF DESCRIPTION OF THE DRAWINGS

Like reference numerals refer to corresponding parts throughout the several views of the drawings.

DETAILED DESCRIPTION OF EMBODIMENTS

Figure 1:
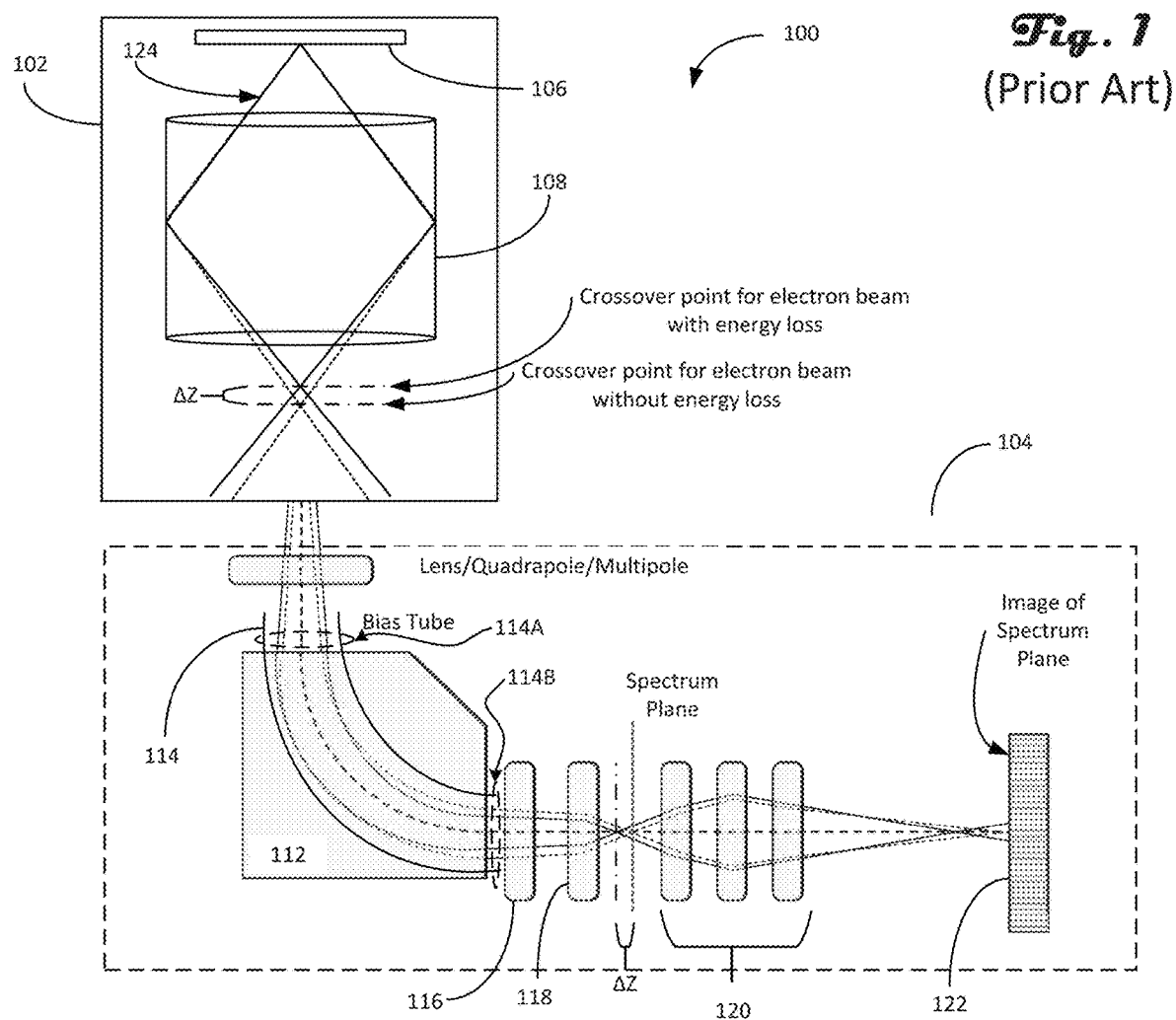
FIG. 1 is an example illustration of a portion of a microscope system as currently known in the art.

Embodiments of the present invention are described below in the context of a charged particle microscope including an energy spectrometer for acquiring energy spectra of a sample, where the energy spectrometer includes an additional optical element that reduces or eliminates defocus in a dynamic manner. For example, depending on operating parameters of the microscope and/or energy spectrometer, the optical element can be electrically biased to refocus an electron beam. However, it should be understood that the methods described herein are generally applicable to a wide range of different a methods and apparatuses, including both scanning-probe systems and parallel illumination systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatuses, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatuses are not limited to any specific aspect or feature or combinations thereof, nor do the disclosed systems, methods, and apparatuses require that any one or more specific advantages be present or problems be solved. Any theories of operation are to facilitate explanation, but the disclosed systems, methods, and apparatuses are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatuses can be used in conjunction with other systems, methods, and apparatuses. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

Electron energy loss spectroscopy (EELS) is a detection technique typically incorporated into a transmission electron microscope (TEM) for analysis of compositional and other chemical properties of a sample. EELS is conventionally performed using an energy spectrometer mounted at the end of the microscope's column. Such energy spectrometer may also be referred to as a post column filter (PCF). Energy spectrometers are used to obtain energy spectra of transmission data. For example, a sample in a TEM is interrogated with an electron beam of a desired energy and some of the electrons exiting from the sample have reduced energy characteristic of various properties of the sample. These properties may be chemical or crystalline, for example. The energy spectrometer may then be used to view the energy distribution of the emerging electron beam to look for peaks at various energy levels that provide data on the sample material. Given current TEM and detector technology, the peaks can be highly resolved to millielectronvolt levels, for example. However, imperfections in the microscopes may blur the data such that the desired resolution is reduced or lost. The loss of resolution may be due to the electron beam being defocused as it propagates through portions of the microscope and the energy spectrometer. This loss of focus may not be static and may change depending on the microscope settings. As higher resolution energy spectra are desired, the defocusing becomes a larger problem. As such, a solution to the problem is highly desirable.

FIG. 1 is an example illustration of a portion of a microscope system 100 as currently known in the art. The microscope system 100 includes a portion of a TEM 102 and an energy spectrometer 104. The microscope system 100 may be used to obtain energy spectra of a sample 106, but may suffer from defocusing of the electron beam 124 on detector 122 due to operating parameters of microscope 102 and energy filter 104.

To illustrate, as electron beam 124 emerges from sample 106 the electron beam 124 takes a trajectory along the optical axis of the microscope 102. This trajectory is dependent upon the energy of the electrons in the electron beam and further dependent upon the operating parameters of the microscope 102. The operating parameters include operating parameters of the projection system 108, for example, such as an adjustment of the magnification setting of the microscope for the magnification from the sample 106 towards the cross-over point at the end of the microscope 102. Freedom of variation of this magnification is desirable for the user of the microscope system, because this magnification determines how much the cone of electron beam 124 exiting the sample is compressed towards the energy spectrometer. More compression results in a larger part of the cone of electron beam 124 being accepted by the spectrometer's entrance aperture. Operating parameters determine excitation settings of optical elements, such as lenses, multipole and quadrupole elements of the projection system 108. It should be noted that the operating parameters are changed depending on the energy of the primary electron beam, e.g., the energy of the electron beam used to interrogate the sample. However, due to sample-electron interaction, the electron beam emerging from the sample will include some energy loss. The energy loss is desirable, however, since measuring the loss at a range of energies is what will be measured by the energy spectrometer 104. Yet, the energy loss also affects the crossover locations of the electron beam in the microscope 102 and the energy spectrometer 104. This change in crossover results in a defocus of the electron beam spectrum on the detector 122.

For example, an electron beam propagating through microscope 102 without any energy loss may have a crossover location, e.g., focal point, as indicated. However, an electron beam having some energy loss will have a different crossover location, AZ offset as indicated, which will propagate through the microscope 102 and the energy spectrometer 104.

The energy spectrometer 104 includes a lens 110, a dispersive element 112, which includes a bias tube 114, lenses 116 and 118, a plurality of optical elements (lenses, quadrupoles, and multipoles) 120 and the detector 122. The dispersive element 112 is energized to disperse or 'fan out' the beam in a band of different energies. The plurality of optics 120 is for focusing and magnifying this band on the detector 122. Typically, this band of energies is smaller (does not cover) the complete range of the EELS spectrum which the operator is interested in and wants to record. Therefore, bias tube 114 is provided that can be electrically biased to add various amounts, up to 2 keV for example, of energy to the electron beam 124. This can be used to shift the band of energies recorded by the detector 122 (such shift of the energy band can, of course, also be accomplished by adjusting the excitation of the dispersive element or by adjusting the operating potential of the electron microscope; such methods, however, have the drawback of having relatively long settling times and/or of suffering from magnetic hysteresis). Because of its electrostatic nature, the liner tube can establish shifts from one energy band to another energy band in just fractions of a millisecond, thus allowing near-simultaneous recording of multiple energy bands (e.g., as described in U.S. Pat. No. 10,832,901B2, incorporated herein for all purposes). The detector 122 may be arranged at a conjugate of a spectrum plane of the spectrometer so that the electron beam is focused on the detector 122.

The various components 110 through 120, like in the microscope 102, may be configured with operating parameters based on the primary electron beam energy, not the energy beam with energy loss. It should also be noted that the ends 114A and 114B of the liner tube 114 may form unintended lenses due to electrical bias differences between the bias tube 114 and the grounded elements that are coupled thereto, such as a liner tube encompassing the optical axis. Since the energy spectrometer 104 is configured to operate based on the energy of the primary electron beam, any defocus of the energy loss beam occurring in the microscope 102 will propagate into the energy spectrometer 104 resulting in a proportional defocus amount of $\Delta Z$. The change in focus will move the crossover point from the spectrum plane to a location before or after the spectrum plane. Such change in crossover point will result in the energy spectra being defocused at the detector 122.

One solution to the above discussed problem includes the addition of an extra optical element into the path of the electron beam to refocus the electron beam onto the spectrum plane, and ultimately the detector. The extra optical component may be inserted anywhere after the sample to just before the detector of an energy spectrometer. The optical element may be energized, e.g., electrically biased, depending on the operating parameters of the microscope and/or the energy spectrometer, and a change in operating parameters results in a change to the electrical bias level of the optical element. As such, as EELS experiments are conducted at different spectrum bands centered at different energy losses, the overall system can be dynamically focused to account for the differing operating parameters while maintaining a desired focus.

The optical element may be any form of charged particle optics, such as a lens or a multipole element. In some examples, the optical element may take the form of two opposing plates, similar to an electrostatic shutter. The two opposing plates may be contained within a circular envelope, where the opposing plates are biased as needed and the envelope is grounded. An example multipole device is a quadrupole, where two opposing members are biased while the others are grounded. However, as one skilled in the art understands, the multipole device provides greater degrees of freedom for beam manipulation, and, as such, can be biased to not only refocus the electron beam but also biased to partly stigmate the electron beam (that is, to a apply a small amount of a cylinder-like lens), as may be needed, e.g., to compensate for small unroundness of the unintended lenses 114A and 114B. Other higher order multipoles are also contemplated herein and would provide greater degrees of freedom for beam manipulation.

Figure 2:
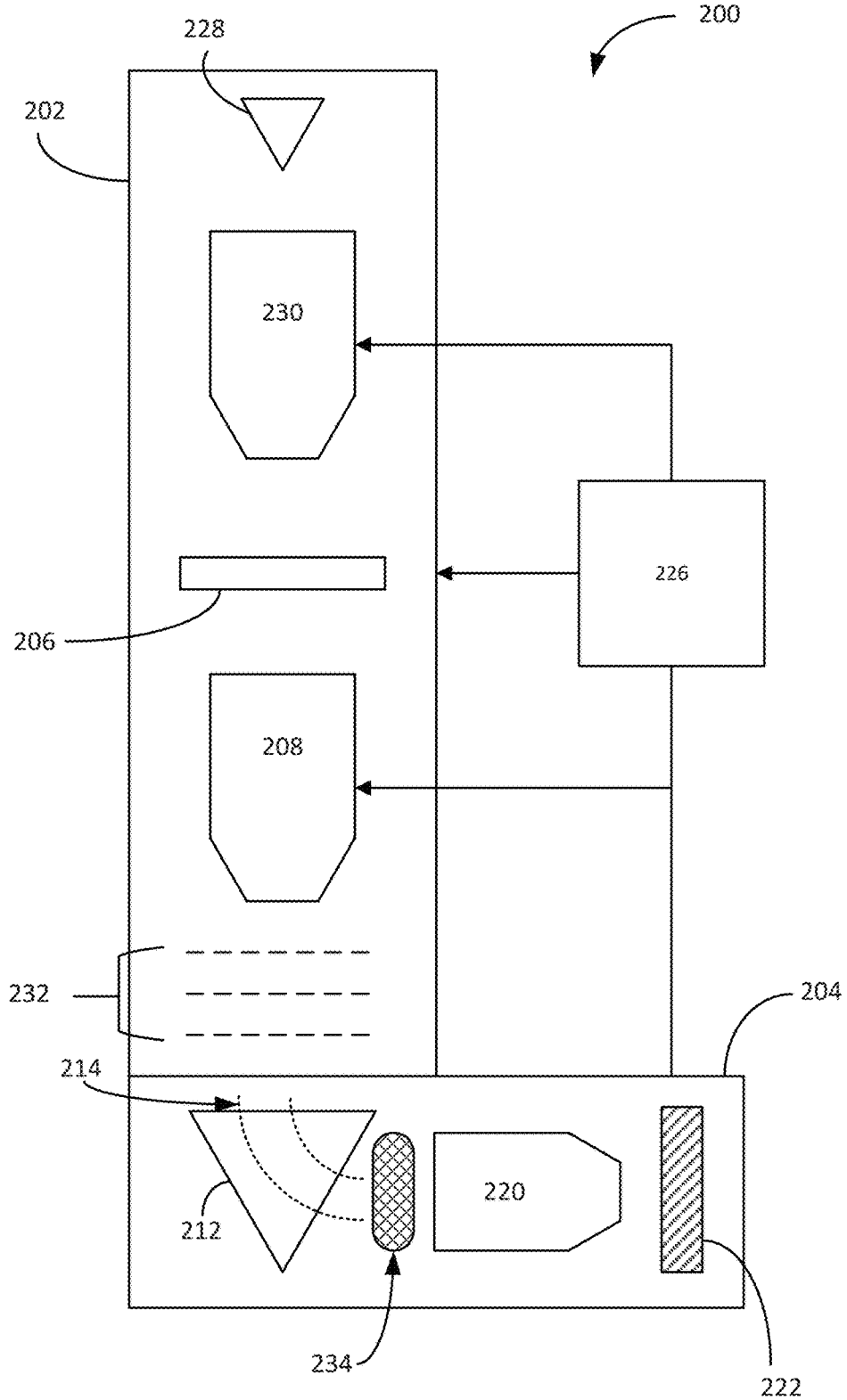
FIG. 2 is a charged particle microscope in accordance with an embodiment of the present disclosure.

FIG. 2 is a charged particle microscope 200 in accordance with an embodiment of the present disclosure. CPM 200 may be a TEM 202 in some examples and includes an energy spectrometer 204. The energy spectrometer may be used to obtain EEL spectra, for example. The CPM 200 may include an optical element to reduce or negate any defocusing problems that occur during acquisition of spectra. In some examples, the optical element can be biased to a level based on the operating parameters of the microscope and/or energy spectrometer so that the refocusing is dynamic.

TEM 202 includes source 228, illumination system 230, projection system 208, various detectors 232, all of which can be controlled by controller 226. Source 228 may be an electron source, such as a Schottky source or a (cold) field emission gun (CFEG) and provides a beam of electrons that propagate along the optical axis of TEM 202 to interact with sample 206. Illumination system 230 includes a plurality of electron optic components to condition the electron beam for delivery to the sample 206. Conditioning the electron beam may include collimation, astigmatism correction and focusing the electron beam at the sample plane. Projection system 208, as discussed above, may include a variety of electrostatic/magnetic lenses, deflectors, correctors (such as stigmators), etc., that are used to focus the electron beam emerging from sample 206 onto one of the various detectors 232. In some examples, projection system 208 focuses and conditions the electron beam for delivery to energy spectrometer 204. The various detectors 232 may individually be moved in and out of the optical path to provide different detection schemes for TEM 202. The detectors 232 may include an imaging screen, a TEM camera and a STEM camera.

Energy spectrometer 204 includes dispersive element 212 (with bias tube 214), optical element 234, a plurality of optics 220, and detector 222. Many of the components of energy spectrometer 204 were discussed with respect to FIG. 1 and will not be revisited for sake of brevity. It will be noted that the other components of energy spectrometer 104 that are not specifically shown in energy spectrometer 204 are included, but left out of the drawing. The additional component, namely optical element 234, is included in energy spectrometer 204 to refocus the electron beam as discussed. In FIG. 2, optical component 234 is shown downstream from dispersive element 212, but this is not the only location to arrange the optical element. See FIG. 3 for alternative locations. In general, optical element 234 can be arranged upstream from dispersive element 212 (but downstream from the sample 206), or it can be arranged downstream of dispersive element 212, such as before, within or after the plurality of optics 220.

Controller 226 may include one or more processing cores and memory storing executable code. In addition, controller 226 may provide operating voltages to some of the components of system 200, or be coupled to voltage supplies (not shown) that provide operating voltages in response to control signals provided by controller 226. For example, controller 226 may provide control and/or voltages to illumination system 230, projection system 208, and optical element 234. Further, controller 226 may control operation of detector 222 and/or receive data from detector 222. In general, controller 226 sets the operating parameters of system 200 and adjusts the electrical bias of optical element 234 to dynamically focus the electron beam onto detector 222 in response to changes in operating conditions of the system 200, such as the magnification.

Optical element 234 may be formed from a multipole element containing two or more electrically conductive elements. In some examples, optical element 234 is formed from two opposing conductive elements, similar to a deflector- or shutter-type arrangement, housed in a conductive body. In other examples, the optical element 234 is formed from a quadrupole or higher order multipole element. Regardless of the physical example, the optical element may be electrically biased to a level based on operating parameters of TEM 202 and/or energy filter 204. For example, a desired minimum or maximum collection angle for the cone of electrons exiting the sample will determine a desired magnification from sample to cross-over and thus will result in excitation energies of the projection optics 208 in the TEM 202; desired bands of EELS spectra (depending on the chemical composition of the sample and the resulting features in the EELS spectra that the operator desires to record) will determine the electrical biases applied to a bias tube 214 included in dispersive element 212 and thus will result in unintended lenses (not shown) at the entrance and exit locations of bias tube 214, similar to unintended lenses 114A and 114B shown in FIG. 1. Such operating parameters may determine what bias level to provide to optical element 234, which may be provided by or controlled by controller 226. For example, the higher the bias to bias tube 214, the higher the bias level provided to optical element 234. In the shutter-type optical element configuration, the two opposing conductive elements may be provided the same electrical bias, which may be from 10 Volts to +10 Volts. Again, the level depends on the operating parameters of CPM 200.

In operation, an electron beam generated by source 228 at a primary energy is projected toward sample 206, where the electron beam interacts with the sample. The interaction may result in some of the electrons losing energy by an amount associated with various material characteristics of sample 206. The electron beam emerging from sample 206 may then include electrons of different energies across a range of energies. The emerging electron beam may then propagate at different trajectories than the electrons of the primary energy, which affects their focal point, e.g., crossover locations, along the rest of the optical path including the energy filter 204 and the TEM 202. As the emerging electron beam passes through the dispersive element 212, the emerging electron beam is (consecutively) steered into different bands of energy by the dispersive element 212 and the bias tube 214 and recorded by the detector 222. However, due to the change in focal point of the different energies, the one or more bands may not be focused on the spectrum plane to which the detector is arranged in conjugate thereof. The defocused problem will result in a loss of resolution. To refocus the electron beam, the optical element 234 is biased based on the current operating parameters. Biasing the optical element 234 will adjust the trajectory of the bands to align their cross-over location with the spectrum plane, and thus the detector 222.

Figure 3:
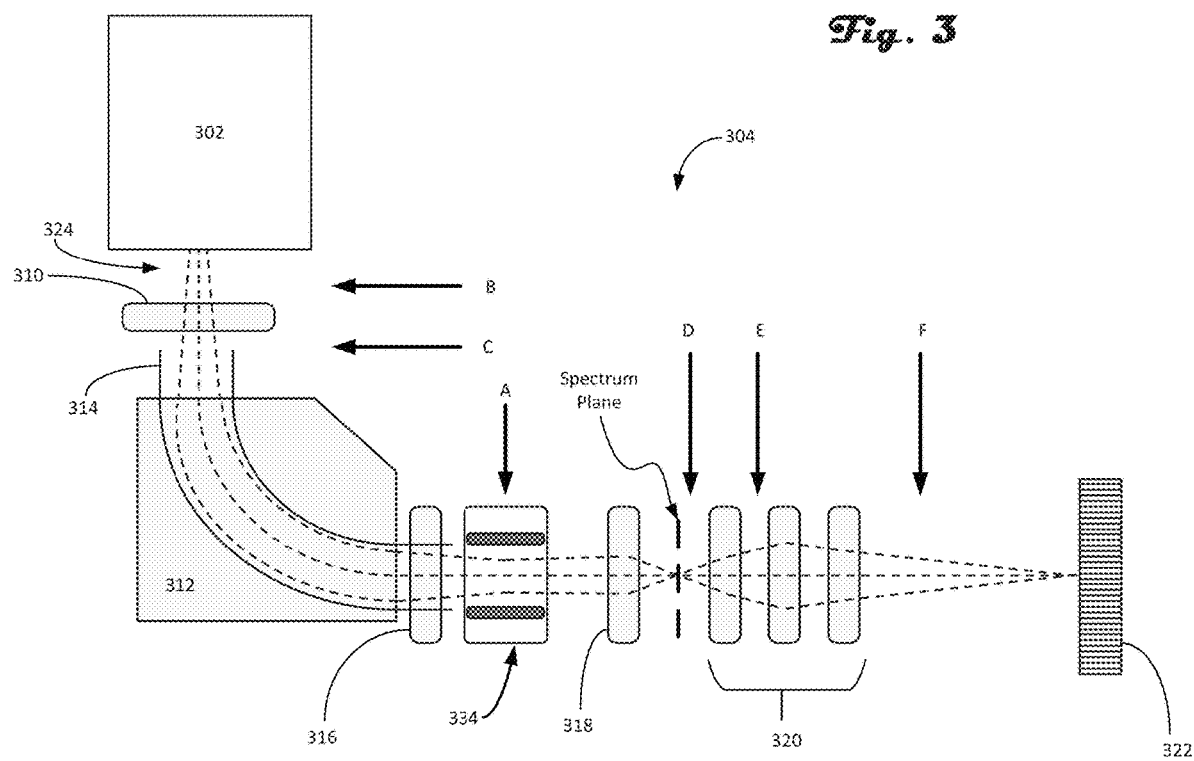
FIG. 3 is an illustrative energy spectrometer including a refocusing optical element in accordance with an embodiment of the present disclosure.

FIG. 3 is an illustrative energy spectrometer 304 including a refocusing optical element in accordance with an embodiment of the present disclosure. The energy spectrometer 304 can be included as an analytical add-on to a TEM, similar to system 200 for example, and is used to obtain energy spectra of a sample. As such, energy spectrometer 304 may receive an electron beam from a TEM 302, and steer the electron beam (consecutively) into a plurality of bands based on the respective energies of the bands. Subsequently, these bands may be directed toward a detector.

Energy spectrometer 304 includes many of the elements disclosed with regards to FIG. 1, which will not be discussed again for sake of brevity. However, energy spectrometer 304 further includes the additional optical element 334 for refocusing electron beam 324 and/or the various energy bands onto the detector 322. The optical element 334 may be a multipole element including 2 or more conductive elements for manipulating the trajectory of the electron beam 324. While now shown, optical element 334 also includes electrical contacts so that the optical element 334 may be electrically biased. For a two conductive element example of the optical element 334, both conductive elements may be biased with the same voltage, which may be in the range from −10V to +10V for example. For optical elements with a higher number of conductive elements, various biasing schemes as known in the art may be employed so that the electron beam 324 is refocused and possibly stigmated.

Although optical element 334 is shown at location A in FIG. 3, other locations are also possible. For example, optical element 334 may alternatively be arranged at locations B, C, D, E and F. Arranging optical element 334 at any of locations A through F is possible, but location A may be the most straightforward in terms of design and fabrication. Some locations other than A, however, may affect the electrical bias requirements. Regardless of location, electrically biasing the optical element 334 based on the operating parameters of TEM 302 and/or energy spectrometer 304 will reduce or eliminate any defocusing of electron beam 324, e.g., refocus electron beam 324, so that the electron beam 324 is focused on the spectrum plane and, ultimately, the detector 322.

Figures 4A, 4B:
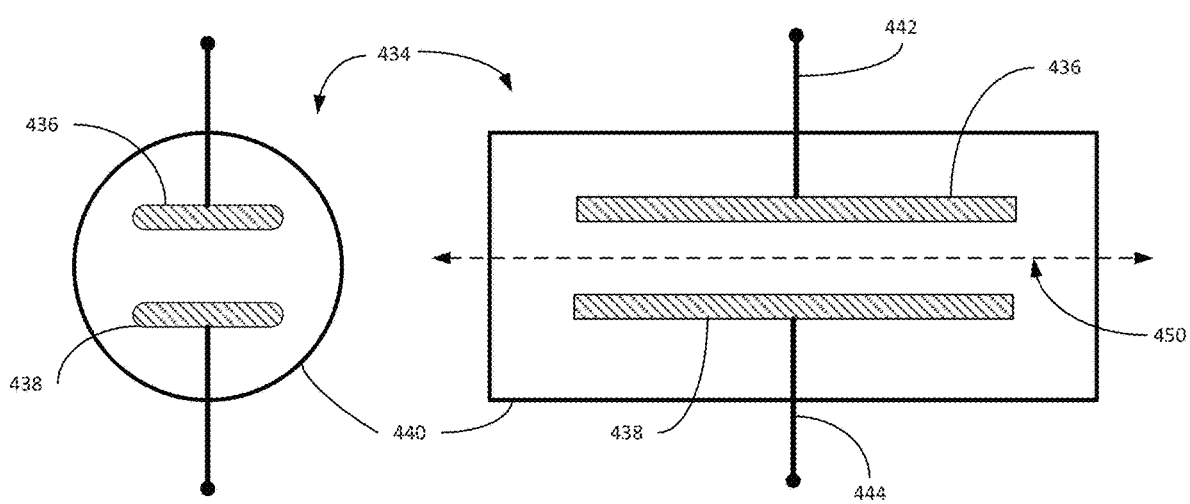
FIGS. 4A and 4B are an end view and a side view, respectively, of an optical element in accordance with an embodiment of the present disclosure.

FIGS. 4A and 4B are an end view and a side view, respectively, of an optical element 434 in accordance with an embodiment of the present disclosure. Optical element 434 includes two opposing conductive elements 436 and 438 arranged inside a housing 440. Electrical contacts 442 and 444 may be included to provide electrically bias conductive elements 436, 438. Housing 440 may also be electrically contacted for either grounding or providing a bias voltage as desired. The two opposing conductive elements may be arranged on opposite sides of an optical axis 450. FIG. 4 shows the two opposing elements positioned above and below the optical axis. In an alternative implementation, these two elements are positioned left and right of the optical axis 450.

Optical element 434 may be included in an energy spectrometer, such as energy spectrometer 304, and may be arranged in the optical path and at any of the locations A through F. In some examples, optical element 434 may be arranged inside a liner tube of the energy spectrometer. In other examples, optical element 434 may form a length of a liner tube.

Figure 5:
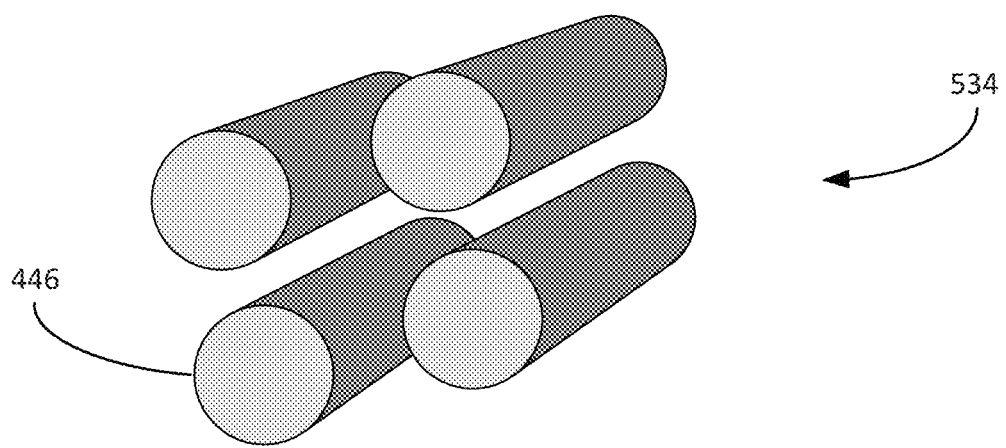
FIG. 5 is a quadrupole in accordance with an embodiment of the present disclosure.

FIG. 5 is a quadrupole 534 in accordance with an embodiment of the present disclosure. The quadrupole 534 is a multipole example of optical element 334, and includes four conductive elements 446. Each element 446 can be electrically biased individually for refocusing an electron beam traveling down it's optical axis, as is known in the art. Quadrupole 534 may be included in an energy spectrometer, such an energy spectrometer 304, at any of the locations A through F.

Figure 6:
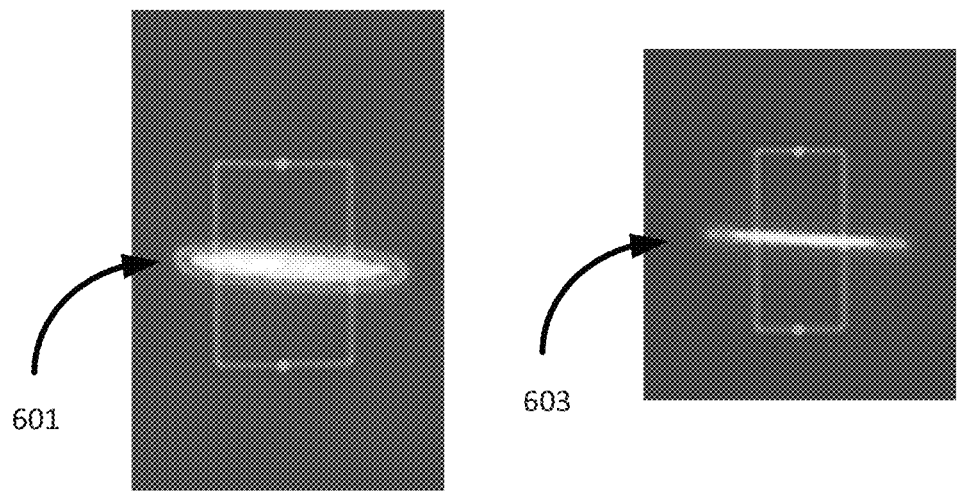
FIG. 6 includes two detector readings acquired by an energy spectrometer in accordance with an embodiment of the present disclosure.

FIG. 6 includes two detector readings 601 and 603 acquired by an energy spectrometer in accordance with an embodiment of the present disclosure. Detector reading 601 shows the detection of an electron beam or sub-band without using a refocusing element as discussed herein. Detector reading 603, however, shows the detection of the electron beam or sub-band with the additional optical element biased in accordance with the operating parameters of a TEM and/or energy spectrometer. In this example, the optical element is biased to 7V. A clear improvement in focus is shown in FIG. 6B.

The embodiments discussed herein to illustrate the disclosed techniques should not be considered limiting and only provide examples of implementation. For example, the optical element disclosed herein could be formed from any number of conductive elements so that the electron beam is not only refocused but also stigmated. Those skilled in the art will understand the other myriad ways of how the disclosed techniques may be implemented, which are contemplated herein and are within the bounds of the disclosure.

What is claimed is:
1. An apparatus comprising:
a charged particle column including a projection system arranged after a sample plane, the projection system is operated using first operating parameters, wherein the first operating parameters are determined by a magnification of the charged particle column;

an energy spectrometer coupled to the charged particle column to acquire one or more energy loss spectra, the energy spectrometer including:
a dispersive element, a bias tube, optics for magnifying an energy loss spectrum and for correcting aberrations, and a detector arranged conjugate to a spectrum plane of the energy spectrometer, wherein the energy spectrometer further includes an optical element electrically biased to refocus at least a portion of an energy loss spectrum onto the detector; and
a controller configured to dynamically focus the energy loss spectrum onto the detector in response to changes in the first operating parameters of the apparatus.

2. The apparatus of claim 1, wherein the optical element is formed from an outer housing with two internal opposing plates, and wherein the two opposing plates are electrically biased and the outer housing is electrically grounded.

3. The apparatus of claim 2, wherein the two opposing plates are equally electrically biased.

4. The apparatus of claim 1, wherein the energy spectrometer is configured to operate using second operating parameters, the second operating parameters setting the operating values of the dispersive element, the bias tube and the optics.

5. The apparatus of claim 4, wherein the value of the electrical bias is further based on the second operating parameters.

6. The apparatus of claim 1, wherein the optics includes a plurality of lenses, quadrupoles and/or multipoles for conditioning the electron beam for detection.

7. The apparatus of claim 1, wherein the optical element is disposed downstream of the bias tube.

8. The apparatus of claim 1, wherein the controller is configured to set the first operating parameters of the charged particle column.

9. An electron microscope comprising:
a source coupled to provide a beam of electrons toward a sample;
a projection system coupled to collect the beam of electrons after passing through the sample and direct the beam of electrons along an optical axis, the projection system configured to operate using first operating parameters, wherein the first operating parameters at least determines a magnification of the electron microscope; and
an energy spectrometer coupled to receive the beam of electrons from the projection system, the energy spectrometer including:
a dispersive device with a bias tube, the dispersive device coupled to steer the beam of electrons consecutively into a plurality of energy bands;
a detector arranged conjugate to a spectrum plane of the energy spectrometer;
a plurality of lenses or multipoles downstream from the dispersive device and arranged to direct the energy bands onto the detector;
an optical element arranged and electrically biased to refocus the energy bands onto the detector; and
a controller configured to dynamically focus the energy loss spectrum onto the detector in response to changes in the first operating parameters of the apparatus.

10. The electron microscope of claim 9, wherein the energy spectrometer is configured to operate based on second operating parameters, the second operating parameters adjust the magnification of the electron microscope, and wherein the level of the electrical bias is further adjusted in response to the second operating parameters.

11. The electron microscope of claim 9, wherein the optical element is formed from an outer housing with two internal opposing plates, and wherein the two opposing plates are electrically biased and the outer housing is electrically grounded.

12. The electron microscope of claim 11, wherein the two opposing plates are equally electrically biased.

13. The electron microscope of claim 9, wherein the optical element is arranged downstream of the dispersive element.

14. The electron microscope of claim 9, wherein the controller is configured to set the first operating parameters of the projection system.

* * * * *